ULTRASTABLE CRYSTAL-CONTROLLED TRANSISTOR OSCILLATOR-MULTIPLIER

Filed Oct. 18, 1966

INVENTOR
JOSEPH E. RACY
BY Philip D. Amins
ATTORNEY

United States Patent Office 3,382,447
Patented May 7, 1968

3,382,447
ULTRASTABLE CRYSTAL-CONTROLLED TRANSISTOR OSCILLATOR-MULTIPLIER
Joseph E. Racy, Nashua, N.H., assignor to Sanders Associates, Inc., Nashua, N.H., a corporation of Delaware
Filed Oct. 18, 1966, Ser. No. 587,501
20 Claims. (Cl. 331—60)

ABSTRACT OF THE DISCLOSURE

The invention is directed to a crystal-controlled frequency-multiplying transistor oscillator which utilizes feedback at the oscillator fundamental frequency from an idler circuit and which also employs the inherent transistor characteristics to generate harmonics of the fundamental frequency of oscillation.

Figure 1:
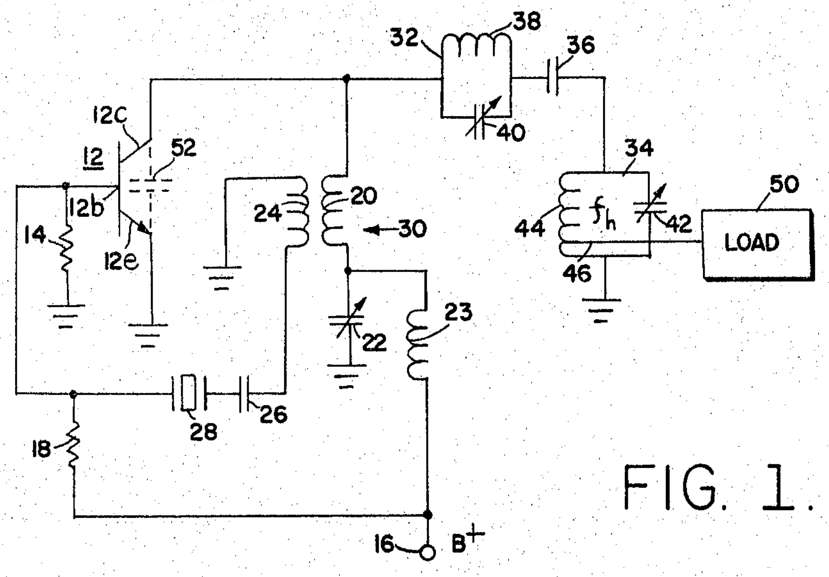

The present invention pertains to a single-stage, ultrastable crystal-controlled oscillator-multiplier. More particularly, the invention relates to a crystal-controlled frequency-multiplying transistor oscillator utilizing feedback at the oscillator fundamental frequency from an idler circuit, and which uses inherent characteristics of the transistor to generate harmonics of the fundamental frequency.

Although there have been some transistors developed which are operable at relatively high frequencies, they are not particularly well suited for use at the high frequencies at which electron tubes such as klystrons and high-frequency triodes are operable. Similarly, although there are presently available some crystals which are resonant at relatively high frequencies, there are not presently available crystals which are operable at the high frequencies at which the aforementioned electronic tubes are operable.

Previous attempts to produce a extremely stable crystal-controlled oscillator which has sufficient output power at very high frequencies, and more particularly in the microwave region, have resulted in the construction of a crystal oscillator having a plurality of varactor multiplying stages. However, the difficulties encountered with this type of arrangement are that it may be costly and more complex than required for some applications.

It is therefore the principal object of the present invention to provide a single-stage ultrastable crystal-controlled solid state oscillator capable of delivering substantial output power at extremely high frequencies, particularly at frequencies in the microwave range.

It is another object of the present invention to provide an ultrastable crystal-controlled transistor oscillator-multiplier, wherein the output frequency is a harmonic multiple of the resonant frequency of the crystal, and thus of the fundamental frequency of oscillation of the transistor, and wherein the harmonic output has the same stability as the fundamental frequency.

It is a further object of the present invention to provide an ultrastable crystal-controlled transistor oscillator-multiplier wherein the output frequency is a harmonic multiple of the fundamental frequency of oscillation of the transistor, and wherein the output frequency is beyond the frequecny capabilities of the crystal and, in many instances, beyond the frequency capability of the transistor.

It is yet a further object of the present invention to provide a single-stage, ultrastable crystal-controlled transistor oscillator-multiplier wherein the feedback of the oscillator is obtained directly from an idler circuit tuned to the oscillator fundamental frequency, whereby the output of the oscillator can be tuned to any harmonic of the resonant frequency of the crystal.

It is still another object of the present invention to provide an ultrastable transistor oscillator-multiplier wherein the transistor exhibits a varactor effect to produce harmonic multiples of the fundamental frequency of oscillation in the oscillator output.

It is still a further object of the present invention to provide an ultrastable crystal-controlled transistor oscillator-multiplier whereby a plurality of harmonic frequencies of the resonant frequency of the crystal can be simultaneously obtained from the oscillator output.

It is yet another object of the present invention to provide an ultrastable crystal-controlled transistor oscillator-multiplier of the aforesaid type which can be used as a signal or marker generator to produce a plurality of frequencies which are harmonically related to the resonant frequency of the crystal employed in the oscillator.

It is a further object of the present invention to provide an ultrastable crystal-controlled transistor oscillator-multiplier for use in a signal or marker generator wherein the oscillator has a plurality of crystals associated therewith and wherein the crystals can be selectively interchanged so as to produce a signal generator having an extensive frequency range.

Figure 2:
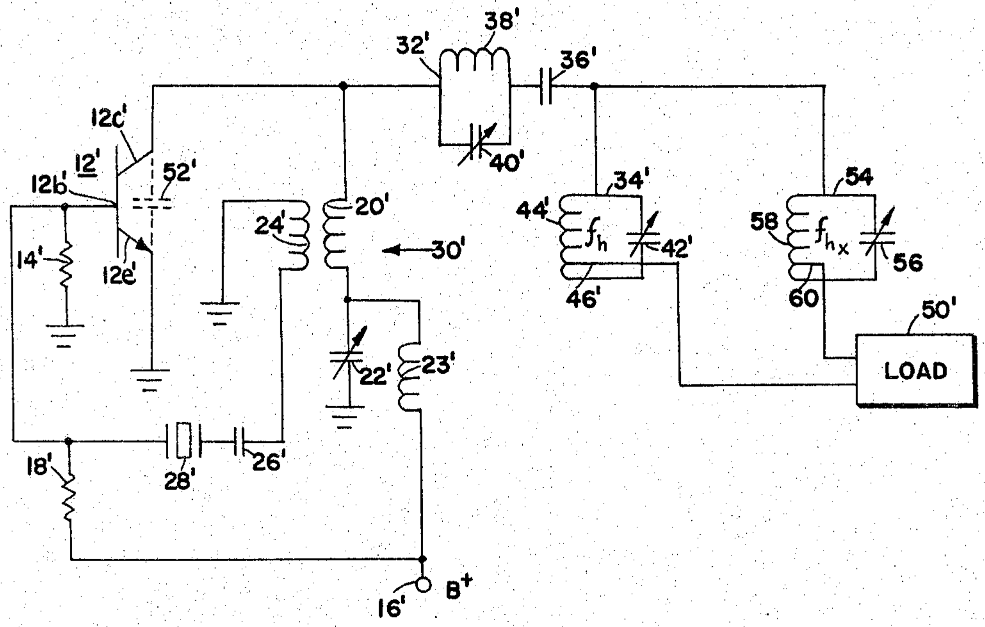

These and other objects, features and advantages of the present invention will become more apparent from the following detailed description, when considered in conjunction with the accompanying drawings, wherein:

FIG. 1 is a schematic illustration of a first embodiment of the ultrastable crystal-controlled transistor oscillator-multiplier of the present invention; and FIG. 2 is a schematic illustration of another embodiment of the ultrastable crystal-controlled transistor oscillator-multiplier of the present invention with multiple outputs.

In carrying out the invention, a crystal-controlled transistor oscillator is caused to oscillate at a fundamental frequency which is the resonant frequency of the crystal, and which is within the frequency capability of the transistor. The transistor has an idler circuit tuned to the fundamental frequency of oscillation, and the idler circuit feeds back the fundamental frequency component of the output to said oscillator through the crystal. The output of the transistor is taken across two of the electrodes having a non-linear capacitance therebetween. The non-linear capacitance acts in the manner of a varactor to provide multiplication of the fundamental frequency to produce an output frequency having higher harmonics of the fundamental frequency, with the same relative stability exhibited by the fundamental frequency of oscillation of the transistor. The output appearing across the transistor's inherent non-linear capacitance is fed, through a blocking tank circuit tuned to the fundamental frequency of oscillation, to a tank circuit or circuits tuned to a selected harmonic(s) of the fundamental frequency of oscillation. The blocking tank serves to cause the signal at the fundamental frequency to flow through the idler circuit, thus blocking any signal component at the fundamental frequency from appearing in the output, and also serving to produce higher harmonic generation across the non-linear capacitance.

Referring now to the drawing, and more particularly to FIG. 1 thereof, there is shown an ultrastable crystal-controlled transistor oscillator-multiplier constructed in accordance with a first embodiment of the present invention. The oscillator-multiplier includes a transistor 12 which is of the NPN type and which is connected to a common emitter configuration. The transistor includes a base 12*b*, a collector 12*c*, and an emitter 12*e*. The base 12*b* of the transistor is connected to ground by means of a bias resistor 14 and is also connected to a power supply terminal 16 by means of another bias resistor 18. The collector 12*c* of the transistor is connected to ground through an inductive coil 20 in series with a capacitor 22, and is also connected to the power supply terminal 16 through the combination of the coil 20 and an RF choke 23. The coil 20 is the primary winding of a transformer $T_1$, whose secondary winding 24 has one end connected to ground. The other end of winding 24 is connected to the base 12*b* of the transistor through the series combination of a capacitor 26 and a piezoelectric crystal 28, the crystal 28 being used in its series resonant mode. The coil 20 and capacitor 22 form an idler circuit 30 which is tuned to the resonant frequency of the crystal 28 which, of course, is the fundamental frequency of oscillation of the oscillator. The collector 12*c* is also connected to a filter or blocking tank 32, which filter is serially connected to a variable tuned tank circuit 34 by means of a coupling capacitor 36. The filter 32 consists of the parallel combination of an inductor 38 and a capacitor 40. The tank circuit 34 consists of a capacitor 42 and an inductor 44 having a variable tap 46 connected to the load 50.

In the operation of the oscillator, the output of the transistor is taken across the collector and emitter terminals, 12*c* and 12*e*, respectively. These terminals have an inherent non-linear capacitance 52 therebetween, i.e., a capacitance that varies substantially in accordance with the voltage applied thereacross, and thus has the characteristics of a varactor. Some transistors which exhibit this characteristic are the 2N918, 2N4072, and 2N3866. It is to be noted, however, that the above types of transistors are merely illustrative and not exhaustive of the various types of transistors which may be utilized in the oscillator of the present invention.

Thus, when the oscillator operates at the fundamental frequency $f_o$, as determined by the resonant frequency of the crystal 28, the output signal appearing between the collector and emitter, and thus across the capacitance 52, causes the capacitance to vary at the fundamental frequency and thus generate harmonics thereof. The fundamental frequency component $f_o$ of the output signal is prevented from passing to the tank circuit 34 by the blocking tank or filter 32, which is tuned to the fundamental frequency $f_o$ and is idled by the idler circuit 30. Thus, the fundamental frequency component $f_o$ passes through the primary winding 20 of the transformer $T_1$ and is coupled by means of the secondary winding 24, through the capacitor 26, which acts as a high-pass filter, through the crystal 28 to the base 12*b*. This feedback of the fundamental frequency component $f_o$ by the circuit components hereinabove described serves to produce higher harmonic generation across non-linear capacitance 52. The capacitor 42 and the inductor 44 of the tank circuit 34 are variable, and thus can be selectively tuned to select any one of a number of harmonics of the fundamental frequency of oscillation; and this harmonic output $f_h$ is then fed to the load 50. The capacitors 22 and 40 are also variable to produce minor adjustments necessitated in the tuning of the oscillator.

It is to be noted, however, that in some applications it may be desirable to utilize an external varactor connected across the collector, emitter terminals. Similarly, although specific reference has been made to an NPN transistor connected in a common emitter configuration, PNP transistors connected in various configurations may be utilized equally well.

Another embodiment of the present invention is depicted in FIG. 2, wherein similar parts are denoted by similar reference numerals. In this embodiment, the operation of the oscillator is the same as that described hereinbefore in conjunction with FIG. 1. The output circuit includes a first harmonic tank circuit 34′ and a second harmonic tank circuit 54. Tank circuit 34′ includes the parallel combination of a variable capacitor 42′ and an inductor 44′ having a movable tap 46′, while the harmonic tank circuit 54 comprises the parallel combination of a variable capacitor 56 and an inductor 58 having a movable tap 60. The tank circuit 34′ is tuned to a harmonic frequency $f_h$ of the fundamental frequency of oscillation $f_o$ of the transistor 12′, and the harmonic tank circuit 54 is tuned to a harmonic frequency $f_{h_x}$ of the fundamental frequency of oscillation of the transistor 12′. Although for simplicity of description there are shown only two harmonically tuned tank circuits, the number of such circuits may be increased up to and including a number corresponding to the number of harmonics which the transistor is capable of producing. Thus, when a plurality of harmonically tuned tanks such as 34′ and 54 are utilized, the oscillator will be capable of simultaneously producing a plurality of output signals whose frequencies are harmonically related to the fundamental frequency of oscillation of the transistor 12′ as determined by the crystal 28′, and the signals will then be fed to the load 50′ by the output taps such as 46′ and 60.

To obtain the desired frequencies, the oscillator may have associated with it a plurality of interchangeable crystals which can be inserted in place of the crystal 28′, either manually or by means of a turret such as the type employed in television receiving sets, whereby the oscillator circuit will then have a relatively broadband range of operation. When the circuit employs a plurality of crystals, it is desirable to make capacitor 26′ variable, so as to compensate for the different fundamental frequencies of oscillation of the transistor 12′. When the oscillator circuit is modified in the manner previously described, the circuit then has great applicability as a signal or marker generator.

It is thus seen that the crystal-controlled transistor oscillator-multiplier herein described produces signals at frequencies above its fundamental frequency of oscillation with the same relative stability exhibited by the fundamental frequency of oscillation, at an appreciable power level and in a relatively simple manner.

While I have shown and described various preferred embodiments of my invention, it will be apparent to those skilled in the art that there are many modifications, changes and improvements which may be made therein without departing from the spirit and scope of the invention as defined in the appended claims.

What is claimed is:

1. A single-stage ultrastable oscillator-multiplier, comprising a transistor having input and output terminals, a crystal connected between said input terminals for controlling the fundamental frequency of oscillation of said oscillator, an idler circuit effectively connected between said output and input terminals to supply regenerative feedback to sustain oscillation at the fundamental frequency, said transistor having a non-linear capacitance between said output terminals, whereby oscillation of said transistor at said fundamental frequency causes harmonics of said fundamental to be generated across said non-linear capacitance, and an output circuit connected to the transistor output terminals including means to block said fundamental frequency from passing therethrough and to pass at least one preselected harmonic of said fundamental frequency.

2. A single-stage ultrastable oscillator-multiplier in accordance with claim 1, wherein said transistor has at least first, second and third elements, said first and second elements being the output terminals, said second and third elements being the input terminals, and wherein the non-linear capacitance between said output terminals is the inherent internal capacitance between said first and second elements of said transistor.

3. A single-stage ultrastable oscillator-multiplier in accordance with claim 2, wherein said first, second and third elements are the collector, emitter and base of said transistor, respectively.

4. A single-stage ultrastable oscillator-multiplier in accordance with claim 3, including means connecting said transistor in a common emitter configuration.

5. A single-stage ultrastable oscillator-multiplier in accordance with claim 1, wherein said idler circuit is tuned to said fundamental frequency, whereby only the fundamental is fed back to said input terminals.

6. A single-stage ultrastable oscillator-multiplier in accordance with claim 1, wherein said output circuit includes a load, and wherein said blocking means comprises a blocking filter tuned to said fundamental frequency.

7. A single-stage ultrastable oscillator-multiplier in accordance with claim 1, wherein said output circuit includes means to variably select and pass one of a plurality of harmonics of said fundamental frequency.

8. A single-stage ultrastable oscillator-multiplier in accordance with claim 1, wherein said output circuit includes means to pass a plurality of preselected harmonics of said fundamental frequency.

9. A single-stage ultrastable oscillator-multiplier in accordance with claim 1, wherein said output circuit includes means to variably select and pass a plurality of harmonics of said fundamental frequency.

10. A single-stage ultrastable oscillator-multiplier in accordance with claim 1, including a plurality of crystals and means for selectively interchanging said crystals so as to selectively vary the fundamental frequency of oscillation.

11. A single-stage ultrastable oscillator-multiplier, comprising a transistor having at least first, second and third elements, a crystal connected to said third element to control the fundamental frequency of oscillation of said oscillator, an idler circuit effectively connected between said first and third elements to supply regenerative feedback to sustain oscillation at the fundamental frequency, said transistor having a non-linear capacitance between said first and second elements, whereby oscillation of said transistor at said fundamental frequency causes harmonics of said fundamental to be generated across said non-linear capacitance, an output circuit including a load connected across said first and second elements, and said output circuit also including means to block said fundamental frequency from passing therethrough and to pass at least one preselected harmonic of said fundamental frequency to said load.

12. A single-stage ultrastable oscillator-multiplier in accordance with claim 11, wherein said idler circuit comprises the series combination of a capacitor and the primary coil of a transformer, and wherein means for effectively connecting said idler circuit between said first and third elements includes the secondary coil of said transformer.

13. A single-stage ultrastable oscillator-multiplier in accordance with claim 12, wherein said first, second and third elements are the collector, emitter and base of said transistor, respectively.

14. A single-stage ultrastable oscillator-multiplier in accordance with claim 13, including means connecting said transistor in a common emitter configuration.

15. A single-stage ultrastable oscillator-multiplier in accordance with claim 11, wherein said idler circuit is tuned to said fundamental frequency, whereby only the fundamental is fed back to said input terminals.

16. A single-stage ultrastable oscillator-multiplier in accordance with claim 12, wherein said output circuit includes a resonant tank circuit comprised of the parallel combination of a variable inductor and a variable capacitor, said tank circuit being arranged to variably select and pass to said load one of a plurality of harmonics of the fundamental frequency of oscillation.

17. A single-stage ultrastable oscillator-multiplier in accordance with claim 12, wherein said output circuit includes a plurality of tank circuits, each of said tank circuits being comprised of the parallel combination of an inductor and a capacitor, and each of said tank circuits being arranged to select and pass to said load one of a plurality of harmonics of the fundamental frequency of oscillation.

18. A single-stage ultrastable oscillator-multiplier in accordance with claim 12, wherein said output circuit includes a plurality of tank circuits, each of said tank circuits comprising the parallel combination of a variable inductor and a variable capacitor, each of said tank circuits being arranged to variably select and pass to said load one of a plurality of harmonics of the fundamental frequency of oscillation.

19. A single-stage ultrastable oscillator-multiplier in accordance with claim 18, including a plurality of crystals, means for selectively interchanging said crystals so as to vary the fundamental frequency of oscillation, whereby said oscillator is capable of operation over a broad frequency range.

20. A single-stage ultrastable oscillator-multiplier, comprising a transistor having collector, emitter and base electrodes, an idler circuit comprising the series combination of a capacitor and the primary coil of a transformer connected between said collector electrode and a common point, the secondary coil of said transformer being connected to said base electrode through a crystal controlling the fundamental frequency of oscillation of said oscillator, said idler circuit being tuned to said fundamental frequency and supplying a regenerative feedback signal through the secondary of said transformer and said crystal to said base electrode to sustain oscillation at said fundamental frequency, said transistor having a non-linear capacitance between said collector and emitter electrodes, whereby oscillation of said transistor at said fundamental frequency causes harmonics of said fundamental to be generated across said non-linear capacitance, an output circuit including a load connected across said collector and emitter electrodes, said output circuit including a filter to block said fundamental frequency from passing therethrough, and at least one tuned tank circuit arranged to pass at least one preselected harmonic of said fundamental frequency to said load.

References Cited

UNITED STATES PATENTS

| | | | |
|---|---|---|---|
| 3,175,168 | 3/1965 | Miyake et al. | 331—116 |
| 3,177,378 | 4/1965 | Pulfer et al. | 331—76 X |
| 3,230,396 | 1/1966 | Boelke | 331—76 X |
| 3,251,007 | 5/1966 | Schmitt | 331—116 |
| 3,252,108 | 5/1966 | Gregory | 331—116 X |

FOREIGN PATENTS 78,516 6/1962 France.

OTHER REFERENCES

J. Specialny, Jr.: Application Lab. Report 646, Philco Corporation, received July 1962 (2 pages).

ROY LAKE, *Primary Examiner.*

S. H. GRIMM, *Assistant Examiner.*